United States Patent [19]
Harlan

[11] 3,962,923
[45] June 15, 1976

[54] FORCE DIRECTED KEYSLIDE CAM
[75] Inventor: Alfred Ray Harlan, Garland, Tex.
[73] Assignee: Motorola, Inc., Schaumburg, Ill.
[22] Filed: Dec. 31, 1974
[21] Appl. No.: 537,727

[52] U.S. Cl. .............................. 74/10.33; 74/10.31; 334/7
[51] Int. Cl.² .......................................... F16H 35/18
[58] Field of Search ............ 74/10.33, 10.31, 10.29, 74/10.27, 10.37; 334/7

[56] References Cited
UNITED STATES PATENTS
| | | | |
|---|---|---|---|
| 3,545,289 | 12/1970 | Ohashi | 74/10.33 |
| 3,550,459 | 12/1970 | Pelletier et al. | 74/10.33 |
| 3,757,590 | 9/1973 | Mears, Jr. | 334/7 |

Primary Examiner—Samuel Scott
Assistant Examiner—Randall Heald
Attorney, Agent, or Firm—James W. Gillman; Donald J. Lisa

[57] ABSTRACT

In the tuning mechanism of a pushbutton radio, pushbutton depression translates the actuating bar of a keyslide mechanism causing the opposing faces of a memory cam to forcibly engage and rotate a treadle bar assembly. The treadle bar assembly couples to the tuning elements of the radio such that assembly rotation determines radio tuning. The cam faces are of predetermined curvature tending to maximize the rotational force applied to the assembly resulting in reduced required pushbutton pressure.

6 Claims, 7 Drawing Figures

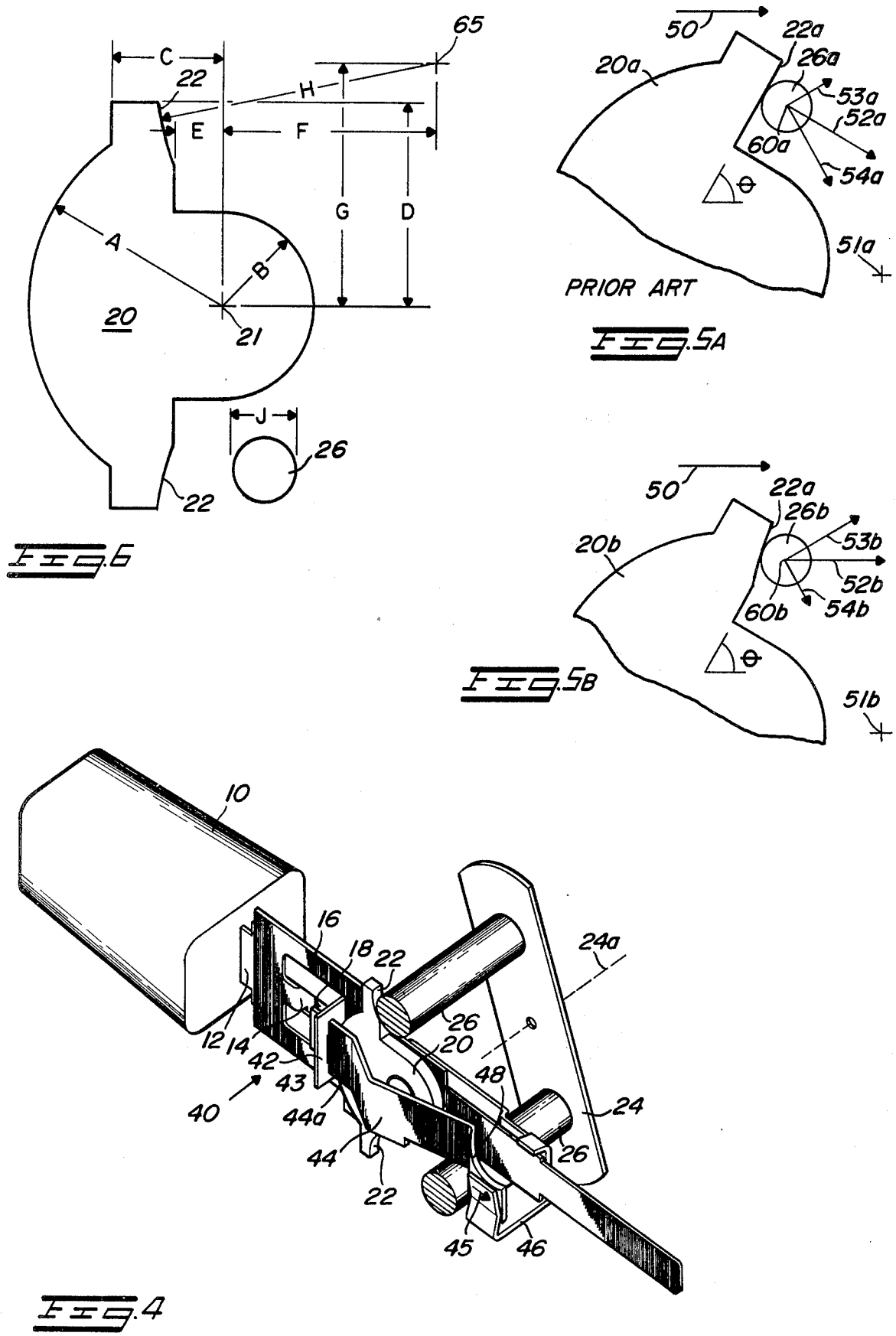

FORCE DIRECTED KEYSLIDE CAM

BACKGROUND

Field of the Invention

This invention relates to the keyslide mechanism of a pushbutton radio receiver and particularly to the memory cam located therein.

Pushbutton tuning is a convenience found on many radio receivers. In a standard automotive type pushbutton radio there is provided a plurality of pushbutton operated keyslide mechanisms for adjusting the frequency of operation of the receiver. Such mechanisms are well known in the art and a detailed description thereof may be found in U.S. Pat. No. 3,195,359 to Clark. Basically, pivotally mounted on the keyslide mechanism is a memory cam which can be frictionally locked at a preselected angle when the pushbutton is pulled outwardly and then returned to a normal position.

The cam has a pair of opposing faces which engage parallel rods of a treadle bar assembly, rotating the assembly to the locked cam angle. Assembly rotation in turn shifts the position of the tuning core carriage of the receiver. Movement of the carriage repositions the tuning cores of the receiver with respect to stationary tuning coils provided therein, thereby to change the frequency of operation of the receiver.

Presently, the memory cam has linear engaging faces, which, when the pushbutton is depressed, make contact with the treadle bar rod at an angle dependent on the initial position of the rod and the locked angle of the cam. As the pushbutton is further depressed, two forces are transmitted from the cam face to the rod. The first force is tangential to the rotational arc of the assembly thus causing assembly rotation. The second force acts through the axial center of the rod towards the axis of rotation of the assembly tending to compress the assembly. As the second force does not rotate the treadly assembly, it undesirably results in a requirement for increased pushbutton pressure. For small angles of treadle bar rotation, the linear cam face exerts a substantial tangential force on the rod and the required pushbutton force is not excessive. However, for large rotations, a considerably greater force is required, as the rotational force component is reduced by a substantial compressional force component. This is undesirable since an inadequate tangential force results in receiver mistuning.

SUMMARY OF THE INVENTION

It is the object of this invention to provide a new and improved pushbutton tuning mechanism, in a pushbutton radio receiver, which rotates the treadle bar assembly with a substantially reduced force applied to the pushbutton regardless of the initial position and travel of the treadle bar assembly.

It is another object of the present invention to provide a new and improved cam of the above described type which can be used conveniently with existing keyslide mechanisms and which is relatively simple in construction and easy to fabricate.

According to the invention, a keyslide mechanism includes a memory cam mounted for pivotal movement. The cam has opposing faces intended for engaging rods of a treadle bar assembly causing rotation of the assembly. The faces of the cam are curved predeterminedly such that contact between cam engaging face and treadle bar rod is always on a plane substantially parallel to the direction of travel of the keyslide mechanism and extending through the axial center of the treadle bar rod, thereby maximizing the rotational component of force applied by the cam to the rod regardless of the initial position or travel of the treadle bar assembly.

DESCRIPTION OF THE DRAWINGS

Referring to the drawings:

FIG. 4 is a perspective view of the keyslide mechanism showing pushbutton plunger rod, memory cam, locking lever and treadle bar assembly;

FIGS. 5a, 5b illustrate the forces applied by the memory cam to the treadle rod for both a conventional cam and a cam according to the invention;

FIG. 6 is a detail of the preferred embodiment of the memory cam.

DETAILED DESCRIPTION OF THE PREFERRED EMBODIMENT OF THE INVENTION

Identical parts have been designated with the same numbers throughout the drawings.

Figure 1:
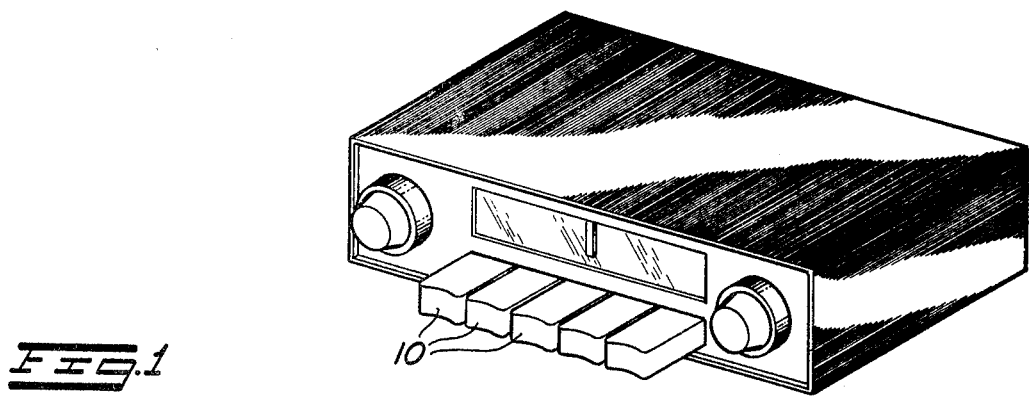
FIG. 1 is a conventional pushbutton tuned automobile radio receiver.

FIG. 1 shows the location of pushbuttons 10 on a typical pushbutton operated radio receiver. Depression of a pushbutton retunes the receiver to a preselected station. Each pushbutton may be programmed by the user to tune the receiver to any desired station on pushbutton depression.

Figure 2:
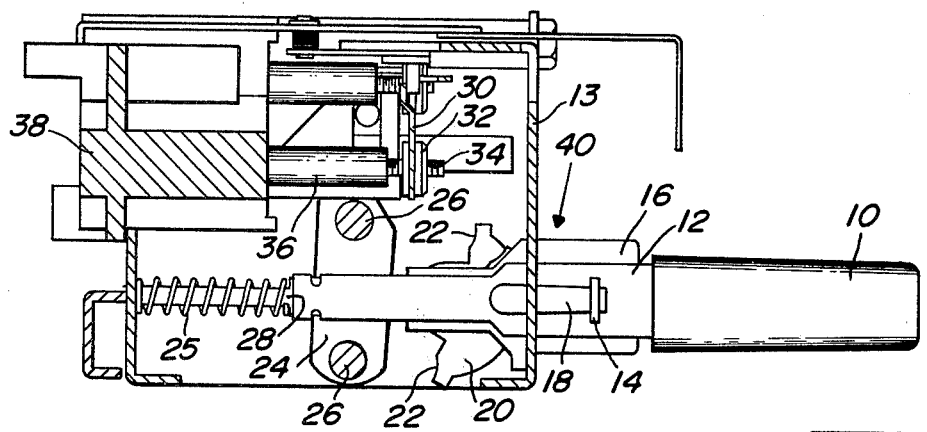
FIG. 2 is a side elevation of the keyslide mechanism in the rest position.

Illustrated in FIG. 2 is the keyslide mechanism 40 comprised of outwardly extended pushbutton 10 which is affixed to and operates actuating bar 12 shown in its rest position cnsiderably extending from chassis 13. T bar 14 of plunger 16 rides in key slot 18 of actuating bar 12. Plunger rod 16 has a projecting pivot (not shown) on which is pivotally mounted memory cam 20. Cam 20 is substantially semicircular with predeterminedly curved engaging faces 22 and an opening 21 for receiving pivot portion (not shown) of plunger rod 16. The mechanism slides in a predetermined plane, preferably the horizontal direction, as plunger rod 16 is so constrained by chassis 13. A spring 25 is concentrically mounted on plunger rod 16 which provides bias to the keyslide mechanism 10 as the spring 25 has one end abutting the rear wall of chassis 13 and the other end abutting a shoulder 28 on plunger rod 16.

Treadle bar 24 with perpendicular mounted parallel rods 26 is pivotally mounted to chassis 13 at a point substantially midway between the axial centers of the treadle bar rods 26. Affixed to one end of the treadle bar 24 is movable carriage 30 which is itself affixed by threaded anchor 32 to screw rod 34. Screw rod 34 is affixed to movable slug 36 which is confined to move within and without the longitudinal axis of the slug tuned coil 38. The coil 38 and slug 36 provide a variable inductance which is coupled to the tuning section of the receiver. The relative position of the slug to the coil thereby defines frequency to which the receiver is tuned.

Figure 3:
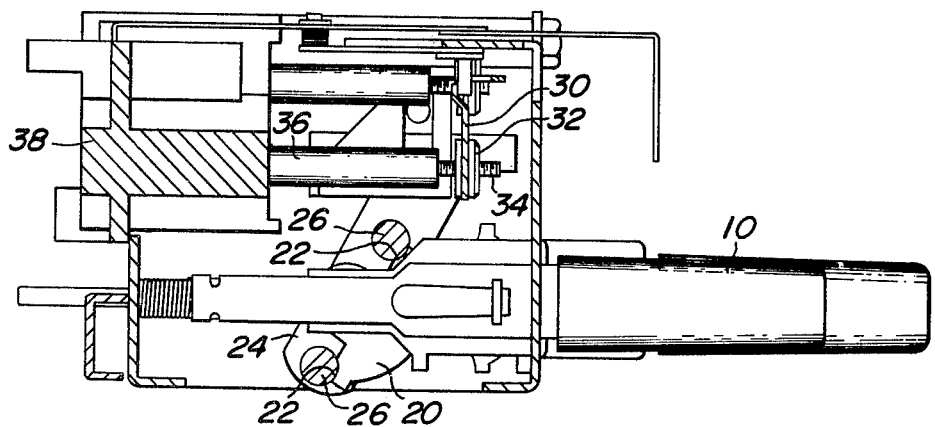
FIG. 3 is a side elevation of the keyslide mechanism in the depressed position.

FIG. 3 illustrates depression of one pushbutton 10 in which the engaging faces 22 of memory cam 20 engage treadle bar rods 26 causing rotation of treadle bar 24, to conform to the preselected angular position of memory cam 20. As the end of treadle bar 24 sweeps an arc, the movable carriage 30 which is constrained to move in substantially the same direction as is required for penetration of movable slug 36 within slug tuned coil 38, is translated. As the carriage 30 is affixed via screw rod 34 and thread anchor 32 to movable slug 36, rotation of the treadle bar 24 as a result of engaging the memory cam 20 of the keyslide mechanism 40 causes lateral translation of the movable carriage 30 changing the relative position of the slug 36 with respect to the slug tuned coil 38, thereby retuning the receiver.

FIG. 4 is a perspective of the keyslide mechanism 40 and treadle bar 24 with perpendicularly mounted parallel rods 26. Shown is the actuator bar 12 extending from and connected to pushbutton 10. Riding in keyslot 18 of actuator bar 12 is T Bar 14 which is a part of plunger rod 16. Pivotally mounted to plunger rod 16 is memory cam 20 having engaging faces 22. Plunger rod 16 has a cut out right angle bracket 42 provided with slot 43 in which is inserted locking lever 44. When pushbutton 10 is depressed, locking portion 46 of actuator rod 12 moves inwardly as shown by the arrow 45 and rides up onto raised portion 48 of locking lever 44. This squeezing action frictionally locks cam 20 by pinching it between plunger rod 16 and locking lever 44 at the point 44a.

Engaging faces 22 of cam 20 are shown engaging the rods 26 of treadle bar 24 causing rotation of treadle bar 24 about an axis 24a which is substantially midway between the axes of treadle bar rods 26.

The advantage of the memory cam according to the invention is best described with reference to force vector diagrams, as is illustrated in FIG. 5.

FIG. 5a illustrates a conventional memory cam 20a. The cam 20 is in a locked angular position $\theta$ and the pushbutton has been depressed translating keyslide and cam in the horizontal direction as indicated by an arrow 50. The cam has linear, opposed faces only one 22a of which is shown. The linear cam face 22a is shown engaging the surface of one of the rods 26a of the treadle bar assembly. The remaining rod is not shown but, as is seen from FIGS. 2, 3 and 4, it is in a position to be engaged by the other cam face when the desired predetermind tuned frequency is set. Further depicted is the treadle bars axis of rotation 51, it being understood that the rods are constrained to rotate about this axis when forcibly engaged by the cam faces.

The force exerted by the cam face 22a on the rod 26a is represented by a force vector 52a emanating from the axial center of the rod 60a perpendicular to the point of impact to the cam face 22a on rod 26a. By vector analysis the force vector 52a may be broken into two components. The first vector component 53a is tangential to a line defined by the axial center of the rod 60a and the axis of rotation 51a of the treadle bar. This component of the engaging force 52 is that force which tends to rotate the treadle bar assembly. The second force component 54a lies on the above defined line and constitutes that force which tends to bend the treadle rod. As the second force 54a does not contribute to rotating the assembly, it constitutes wasted pushbutton pressure. For cases wherein the treadle assembly must rotate through extreme angles to conform to the locked cam angle there will be portions in which the second force vector 54a is of substantial magnitude, the first vector component correspondingly small. Thus, considerable pushbutton pressure would be necessary to initiate rotation of the treadle assembly toward the proper angle. Upon application of increasing pushbutton pressure to move the bar assembly, the assembly first resists movement and then jumps out of the stationary position, resulting in mistuning and requiring a second depression of the pushbutton or manual retuning. Further the hard "feel" is undesirable.

FIG. 5b illustrates the improved cam according to the invention. The cam 20b is locked at the same angle $\theta$ as the conventional cam 20a of FIG. 5a. Also, the treadle rod 26b and treadle assembly axis of rotation 51b are in the same relative position. Further, the cam is translated in the same, horizontal direction 50 with the same force as the cam in FIG. 5a. Due to the predetermined curvature of the face 22b of the improved cam 20b, however, the engaging force 52b of the cam face on the rod surface acts through the rod's axial center 60b and in a line parallel to the direction of movement 50 of the keyslide and cam. The improved cam's face curvature is such that for any locked position of the cam or relative initial position of the treadle assembly the above relationship will hold.

Even though the magnitude of the engaging force of the cams 20a, b to the rods 26a, b is the same for both illustrations, if the tangential force vector 53b and the radial force vector 54b components of the engaging force are constructed, it is apparent that the magnitude of the tangential or rotational vector 53b of the improved cam has a greater magnitude than the same vector of the conventional cam. Similarly, the improved cam has a reduced radial vector. As a greater component of the engaging force of the improved cam becomes a rotational force, the system with the improved cam requires less pushbutton force for automatic tuning and greatly reduces the chance of mistuning due to insufficient pushbutton pressure. The "feel" is greatly improved due to reduced resistnce to initial movement of the bar assembly.

FIG. 6 is a detail of a preferred embodiment of the memory cam 20 and cross section of a treadle rod 26. The cam is provided with a centrally located pivot point 21 which is used as a pivot for a major and a minor radius. The major radius A defines an arc for the substantially semicircular backside of the cam. This arc extends to a vertical line which is a horizontal distance C to the backside of the pivot point 21. The backside of the opposing cam faces extend for a vertical distance away from the horizontal axis of the cam along the vertical line to a horizontal line D measured vertically from the pivot point 21. The minor radius B defines an arc for the front side of the cam which is semicircular. The end points of the front arc continue in a horizontal line for a distance E towards the backside of the cam, at which point the front opposing faces of the cam extend a vertical distance away from the horizontal axis of the cam to the point where the predetermined curvature of the cam face is detailed. The predetermined curvature extends both faces in a substantially vertical dimension further away from the horizontal axis of the cam until each meets a horizontal line which is a vertical distance D from the pivot point 21. The detail of the cam follows this horizontal line to union with the backside of the cam face.

The predetermined face curvature is defined by an arc whose pivotal point 65 is a horizontal distance F from the pivot point 21 towards the front side of the cam and a vertical distance G away from the horizontal axis of the cam. The radius of the arc is a dimension H.

The predetermined curvature was based on a treadle rod having a circular cross section of diameter J, and a treadle bar radius of K measured from the axis of rotation of the treadle assembly to the axial center of each treadle rod.

For a standard rod 26 of diameter J = 0.156 inch (3.96 mm), and a treadle bar assembly of radius K = 0.3025 inch (7.68 mm), it was found that a cam according to the invention has dimensions:

A = 0.3375 inch (8.57 mm)
B = 0.1595 inch (4.05 mm)
C = 0.190 inch (4.83 mm)
D = 0.343 inch (8.71 mm)
E = 0.0815 inch (2.07 mm)
F = 0.367 inch (9.32 mm)
G = 0.511 inch (12.98 mm)
H = 0.528 inch (13.41 mm)

While a specific embodiment of the cam and rod have been shown, it is understood that many variations thereof are possible all of which are within the spirit and scope of the invention.

For example, while a treadle rod is shown having a circular cross section, the invention is not confined to only circular cross section rods. The scope of the invention includes a cam face and a rod surface of predetermined shape such that upon pushbutton depression, the keyslide translates within a plane causing th cam face to forcibly engage the rod surface whereby a force is transmitted to the rod which acts through the axial center of the rod and within a plane parallel to the plane of travel of the keyslide. Such predetermined faces and rods may encompass countless different shapes.

I claim:

1. A tuning mechanism for a pushbutton radio including a combination;
   a treadle bar assembly having parallel rods constrained to rotate about an axis, each rod having an engaging surface,
   a cam provided with engaging faces,
   a directionally movable coupling means coupling the cam faces to the rod surfaces,
   the faces and surfaces of predetermined shape whereby the point of contact of a rod surface with a cam face is substantially within a plane parallel to the plane of movement of the coupling means and extending through the axial center of the rod.

2. The tuning mechanism of claim 1 wherein the predetermined rod surface is substantially circular in cross section.

3. The tuning mechanism of claim 1 wherein the plane of movement of the coupling means extends through the axis of rotation of the treadle bar assembly.

4. In a pushbutton radio receiver having;
   a plurality of stationary tuning coils,
   a plurality of tuning cores mounted with respect to the coils such that tuning of the radio receiver is effected by movement of the cores with respect to the coils,
   a treadle bar assembly comprised of parallel rods suspended such that the rods rotate about an axis, each rod provided within an engaging surface, the assembly coupled to the cores such that rotation of the assembly forces movement of the cores with respect to the coils,
   a plurality of keyslide mechanisms with memory cams mounted thereon, the mechanism movable substantially in a first plane parallel to the rotational axis of the treadle bar assembly, the memory cam having engaging faces adapted for engaging the engaging surface of the rods of the treadle bar assembly upon actuation of one of the keyslide mechanisms to cause rotation of the treadle bar assembly wherein the improvement comprises:
   the rods' engaging surfaces and the memory cams' engaging faces having a predetermined curvature such that upon the memory cam face engaging the treadle rod, the point of contact between the cam face and the rod surface is in a second plane substantially parallel to the first plane, the second plane extending approximately through the axial center of the treadle rod.

5. The pushbutton radio receiver of claim 1 wherein the engaging surface of the rod is substantially circular in cross section.

6. The pushbutton radio receiver of claim 1 further comprised of the keyslide mechanism movable in a first plane extending through the rotational axis of the treadle bar assembly.

* * * * *